United States Patent [19]

Flora

[11] Patent Number: 4,539,517
[45] Date of Patent: Sep. 3, 1985

[54] METHOD FOR TESTING AN INTEGRATED CIRCUIT CHIP WITHOUT CONCERN AS TO WHICH OF THE CHIP'S TERMINALS ARE INPUTS OR OUTPUTS

[75] Inventor: Laurence P. Flora, Covina, Calif.

[73] Assignee: Burroughs Corporation, Detroit, Mich.

[21] Appl. No.: 447,733

[22] Filed: Dec. 7, 1982

[51] Int. Cl.³ .............................................. G01R 31/28
[52] U.S. Cl. ................................................. 324/73 R
[58] Field of Search ........... 324/73 R, 73 AT, 73 PC; 371/24-27

[56] References Cited

U.S. PATENT DOCUMENTS

| | | | |
|---|---|---|---|
| 4,200,224 | 4/1980 | Flint | 324/73 R X |
| 4,404,519 | 9/1983 | Westcott | 324/73 R |
| 4,450,402 | 5/1984 | Owen | 324/73 R |
| 4,465,968 | 8/1984 | Stauers | 324/73 R |

FOREIGN PATENT DOCUMENTS 2365280 7/1975 Fed. Rep. of Germany .... 324/73 R

*Primary Examiner*—Gerard R. Strecker
*Attorney, Agent, or Firm*—Nathan Cass; Kevin R. Peterson

[57] ABSTRACT

Methods are disclosed which provide for testing a wide variety of different types of electrical circuit devices, such as PROM integrated circuit chips, with very little if any programming being required, and without concern as to which of the terminals of the chip are inputs or outputs. The testing apparatus achieves this result by taking advantage of the significant difference in the input and output impedances of most chips to permit treating the logical levels on both inputs and outputs of the chip in a like manner while generating a running signature output in response to a series of input test patterns, the resulting final signature obtained being indicative of the operation of the chip. Provision is also made for testing circuits having internal storage and/or requiring special power or clock inputs.

11 Claims, 4 Drawing Figures

FIG. 2.

| CHIP TERMINALS | 1 | 2 | 3 | 4 | 5 | 6 | 7 | 8 | 9 | 10 | 11 | 12 |
|---|---|---|---|---|---|---|---|---|---|---|---|---|
| TYPE | I | P | P | I | I | P | P | I | I | P | I | P |
| TEST PATTERN | 1 | 0 | 1 | 0 | 1 | 1 | 0 | 0 | 1 | 1 | 1 | 0 |
| NORMAL CHIP OUTPUTS | - | 1 | 0 | - | - | 0 | 1 | - | - | 0 | - | 1 |
| RESULTING OUTPUT PATTERN | 1 | 1 | 0 | 0 | 1 | 0 | 1 | 0 | 1 | 0 | 1 | 1 |

METHOD FOR TESTING AN INTEGRATED CIRCUIT CHIP WITHOUT CONCERN AS TO WHICH OF THE CHIP'S TERMINALS ARE INPUTS OR OUTPUTS

CROSS-REFERENCE TO RELATED PATENT APPLICATION

My commonly assigned copending patent application Ser. No. 447,732 for Integrated Circuit Chip Testing Apparatus filed concurrently herewith is directed to related subject matter.

BACKGROUND OF THE INVENTION

The present invention relates generally to improved apparatus and methods for testing electrical circuit devices, particularly integrated circuit chips and the like.

The conventional approach to testing integrated circuit chips is to employ testing apparatus which can be adapted (by programming or the like) for testing a plurality of different types of integrated circuits. In such an approach, a series of test input patterns are applied to the inputs of the chip being tested while the outputs are monitored to determine whether the proper corresponding output patterns are obtained. Such test equipment is complex and expensive, since the input and output patterns of integrated circuit chips may vary widely. Also, the time required for reprogramming the tester for each different chip slows up the testing process. In addition, where programmable chips are to be tested (such as PROMs), the particular input-output pattern may be changed many times during design and de-bugging phases.

BRIEF DESCRIPTION OF THE INVENTION

In accordance with preferred embodiments of the present invention, relatively simple and inexpensive novel methods are provided which make it possible to test a wide variety of different types of integrated circuit chips with very little, if any, programming being required.

An additional advantage of the present invention is that specific knowledge of the design and operation of a chip are not required. In fact, it is not even necessary to know which of the chip's output terminals are inputs or outputs.

The above features are achieved in a preferred embodiment of the invention which takes advantage of the significance difference in the input and output impedances of typically used integrated circuit chips to provide for testing a chip in a manner which is able to provide reliable test results, while treating both input and output terminals of the chip being tested in a like manner without concern as to which are inputs or outputs. In an extended preferred embodiment, provision is additionally made for testing chips which require input power and/or one or more input clocks.

The specific nature of the invention as well as other features, advantages, objects and uses will become evident from the following description of preferred embodiments taken in conjunction with the accompanying drawings.

BRIEF DESCRIPTION OF THE DRAWINGS

FIG. 2 is a table illustrating an example of the operation of the preferred implementation of FIG. 1.

DETAILED DESCRIPTION OF THE INVENTION

Like numerals refer to like elements throughout the figures of the drawings.

Figure 1:
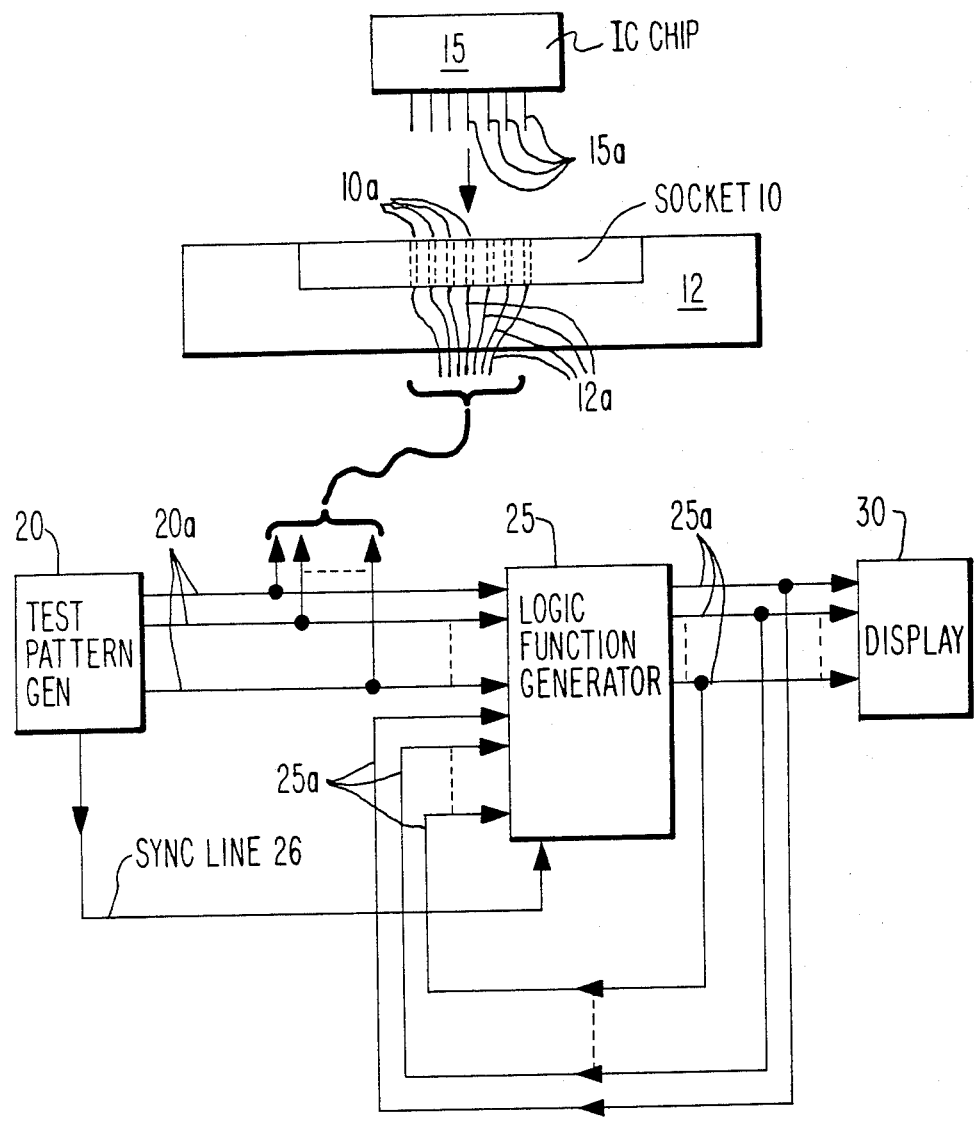
FIG. 1 is an overall block and schematic electrical diagram of a preferred implementation in accordance with the invention.

Referring initially to FIG. 1, illustrated therein is an overall block and schematic diagram of a preferred implementation in accordance with the invention. As shown, a socket 10 having contacts 10a is suitably supported in a supporting member 12. The socket 10 is of conventional design for receiving the terminals or pins 15a of an integrated circuit chip 15 which, for example, may be a PROM (programmable read-only memory). As is conventional, certain ones of the terminals are inputs and certain other ones are outputs, depending upon the type of chip. As will become evident shortly, the apparatus of FIG. 1 is able to successfully test the chip 15 without concern as to which of the chip terminals are inputs or outputs. Also, the chips can have different numbers of terminals 15a as long as the terminals that a chip does have are suitably received by the socket 10. Thus, no programming is required in order to be able to test different chips having different input and output terminal configurations as well as different numbers of terminals. For present purposes, it will be assumed that the chip to be tested does not require a clock input or a special power input, such as is typically the case for a PROM. Thus, no programming at all would be required for different chips using the preferred implementation illustrated in FIG. 1.

Continuing with the description of FIG. 1, leads 12a are respectively connected to the socket contacts 10a and have signals applied thereto via respective lines 20a from a test pattern generator 20 for serially applying logical signals representing different test patterns to the terminals of a chip 15 disposed in the socket 10. The lines 20a are also applied to a logical function generator 25 which, in response thereto, provides outputs on lines 25a which are fed back to serve as inputs to the logical function generator 25 along with the outputs on lines 20a.

A most important feature of the present invention resides in the provision of a properly chosen driving impedance for each line 20a of the test pattern generator relative to the respective input and output impedances of the chip terminals 15a. More specifically, the driving impedance is chosen such that it is low enough to permit driving a chip input terminal to an acceptable input logical level, while being high enough to permit a chip output terminal to retain a recognizable logical output level corresponding to that which would be produced in response to the input logical signals applied to the chip input terminals.

In other words, the driving impedance of the test pattern generator 20 is chosen so that the application of a pattern of logical signals therefrom to the terminals 15a of a chip 15 disposed in the socket 10 in FIG. 1 will produce a resulting logical signal on each of lines 20a as follows: (1) if the line is connected to a chip input terminal (or a blank or unused terminal), then the resulting signal on the line will be recognizable as having the same logical level as provided by the test pattern generator 20; (2) if on the other hand the line is connected to a chip output terminal, then the resulting signal on the line will be recognizable as having the same logical value as the output signal which would normally be provided by the chip output terminal in response to the logical signals applied to the chip input terminals.

An example of (1) and (2) above is shown in FIG. 2. The first row identifies, for example, twelve chip terminals. The second row indicates each chip terminal type, an "I" indicating an input terminal and a "P" indicating an output terminal. The next row illustrates a typical signal pattern applied to lines 20a by the test pattern generator 20 in FIG. 1. The next row (which is the next to last row in FIG. 2) shows the resulting "1" and "0" logical levels normally produced on the chip output terminals "P" in response to the signals applied to the chip input terminals by the test pattern generator 20. Finally, the last line in FIG. 2 shows the resulting logical levels which are produced on lines 20a and applied to the logical function generator 25 in FIG. 2.

In order to obtain the above described operation, as illustrated for example in FIG. 2, it is important that each chip to be tested have a sufficient difference between its respective input and output impedances so that an appropriate driving impedance can be chosen for the test pattern generator 20 which will provide the above described operation. I have discovered that most PROMs and chip families have a sufficient difference in the impedances of their respective input and output terminals to permit operation as described above. For example, most standard TTL chip families will operate as exemplified in FIG. 2 using an approximately 120-ohm resistive driving impedance for the test pattern generator 20 with logical levels of 3 and 0 volts.

So far, it has been shown how a preferred embodiment of the invention provides for applying a test pattern to a chip without concern as to which chip terminals are input and output terminals, and, in response to the test pattern, obtaining a resulting output pattern which is indicative of the operating performance of the chip. The fact that this resulting output pattern is indicative of chip operating performance will be appreciated by realizing that this output pattern will include the output logical levels normally produced by the chip in response to the logical levels applied to the chip input terminals by the test pattern. It will thus be understood that, as the test pattern generator 20 in FIG. 1 produces a series of different test patterns, the operating performance of a chip in socket 10 can be determined by monitoring the resulting output patterns obtained on lines 20a.

A preferred way of monitoring the output patterns produced on lines 20a in FIG. 1 in response to a series of test patterns provided by the test pattern generator 20 is by use of the logical function generator 25 as shown in FIG. 1. Rather than attempting to analyze each output pattern obtained on lines 20a, each newly obtained output pattern is combined with a running signature pattern obtained from output lines 25a of the function generator 25. This running signature pattern on lines 25a is a function of all of the previously obtained output patterns and is fed back to the input of the function generator 25 via lines 20a for combination with each newly obtained test pattern. This, in turn, produces a new running signature pattern on lines 25a which is fed back for combination with the next output pattern obtained to produce a new running signature pattern and so on. The operations of the test pattern generator 20 and the function generator 25 are synchronized using a synchronizing line 26.

The last running signature pattern obtained on output lines 25a of the logical function generator 25 in FIG. 1 after the series of test patterns provided by the test pattern generator 20 has been completed will be referred to as the final signature pattern produced by the chip being tested. Since this final signature pattern will have a value which is dependent upon the performance of the chip in response to all of the test patterns provided by the test pattern generator 20, this final signature value is used as an indication as to whether or not the chip is defective. For this purpose, the final signature may, for example, be applied to a suitable display 30, such as shown in FIG. 1, to provide an appropriate indication to an operator.

It is to be understood that the present invention may satisfactorily be practiced using a wide variety of test patterns provided by the test pattern generator 20, and using a wide variety of transformation functions provided by the logical function generator 25. For an unknown chip or PROM, a non-defective one of the same type can be tested by the apparatus of FIG. 1 to obtain a final signature against which untested ones can then be compared for defects. For standard chips, correct final signatures can be predetermined and made available to an operator for comparison when a corresponding chip is tested.

Figure 3:
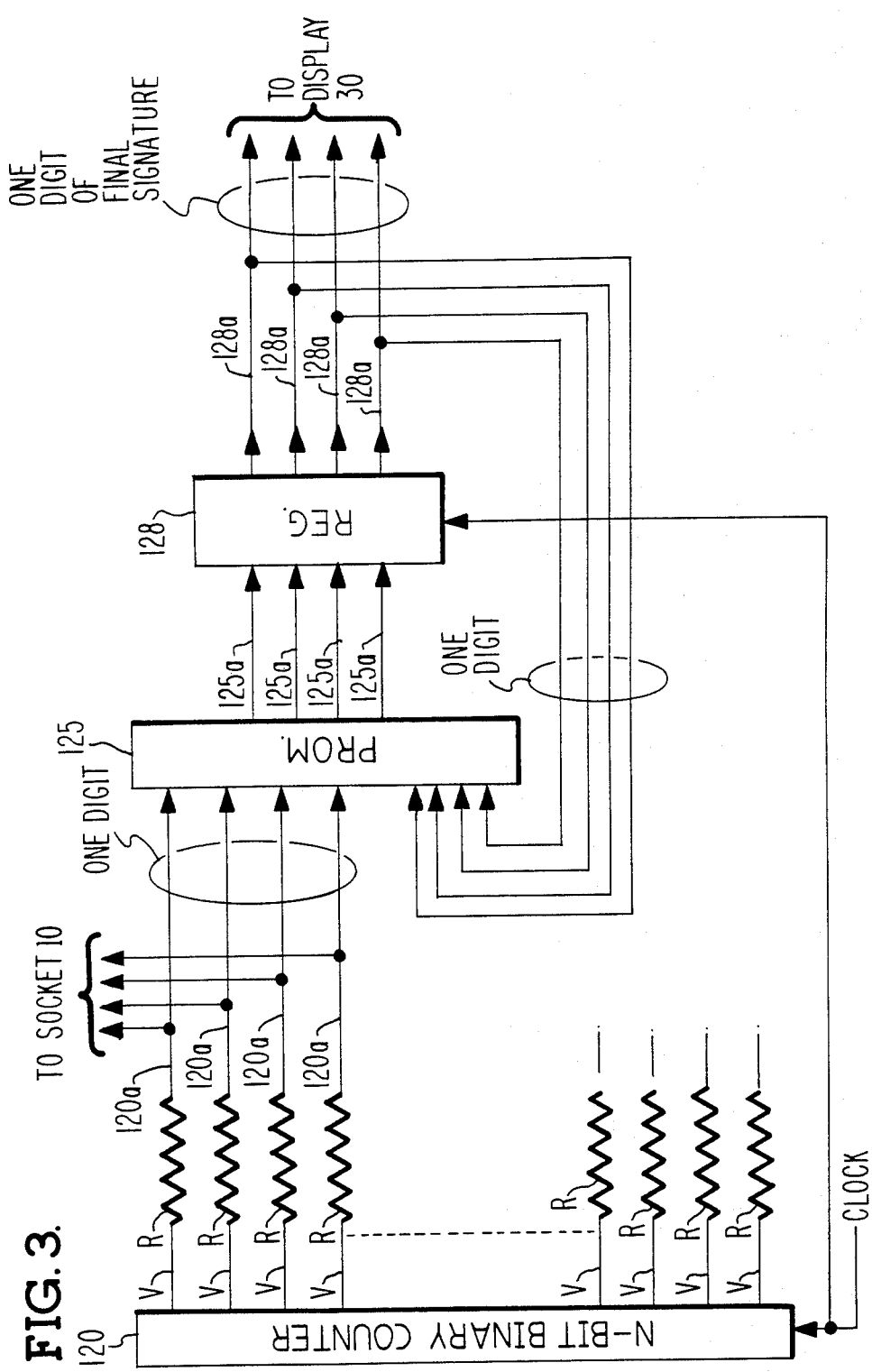
FIG. 3 is a block and schematic electrical diagram of a more specific preferred implementation in accordance with the invention.

A more specific, particularly advantageous implementation of the invention is illustrated in FIG. 3. Since there need be no concern as to which chip terminals are inputs or outputs, it is of particular advantage to employ as the test pattern generator 20 in FIG. 1 an N-bit binary counter 120 such as illustrated in FIG. 3 where N is equal to the number of receiving contacts 10a provided by the socket 10a in FIG. 1. Such a choice is advantageous not only because of its simplicity and economy, but also because it permits all possible test patterns to be produced by the counter 120 and applied to the chip being tested for the number of contacts 10a involved, thereby making it more likely that the final running signature obtained will catch a defect. The appropriate driving impedance required in order to obtain the previously described operation of the apparatus of FIG. 1 is provided by inserting a resister R of proper value in series with each output line 120a of the N-bit binary counter 120. Of course, the logical signal levels V provided at each output of the counter 120 are also chosen to have appropriate values for the chips being tested.

The logical function generator 25 in FIG. 1 is advantageously implemented in FIG. 3 by providing a PROM 125 and an associated register 128 for each digit of the N outputs provided by the counter 120, a digit being four lines. The PROM 125, register 128 and associated lines shown in FIG. 3 illustrate the implementation provided for only a single digit, but it is to be understood that other digits may be implemented in a like manner.

The PROM 125, similar to the function generator 25 in FIG. 1, operates to provide outputs on line 125a representative of the updated running signature in response to an input address constituted by the combination of the signals on lines 120a and 128a. The difference is that the PROM outputs 125a are for only a single digit of the running signature. The signals on lines 120a in FIG. 3 correspond to lines 20 in FIG. 1 and represent the digit output pattern obtained for a single digit when a test pattern is applied to the four chip terminals corresponding to that digit. The signals on lines 128a correspond to the lines 25a in FIG. 1 and are obtained from a register 128 which stores the updated running signature digit represented by the PROM outputs 125a corresponding to the same respective digit at each clock pulse. Thus, operation of the FIG. 3 implementation is such that, at each clock, the N-bit binary counter 120 provides a new test pattern, while each register 128 stores a respective digit of the current running signature appearing on lines 125a of its respective PROM 125 in response to the corresponding digits of the current test pattern and the previous running signature.

The PROM 125 in FIG. 3 may be programmed in many ways to provide a suitable running signature digit. The following relationship is one example which has been found to be appropriate for testing TTL types of integrated circuit devices:

$$Rnew = (Rold + B1 + 3B2 + 5B3 + 7B4) \, MOD \, 13$$

where Rnew is the new running signature digit (produced by PROM 125 on lines 125a in FIG. 3), Rold is the previous running signature digit (provided by the register 128 on lines 128a in FIG. 3), and B1, B2, B3 and B4 are the respective binary values obtained for the four bits of the corresponding digit of the current test pattern (provided on lines 120a in FIG. 3).

Figure 4:
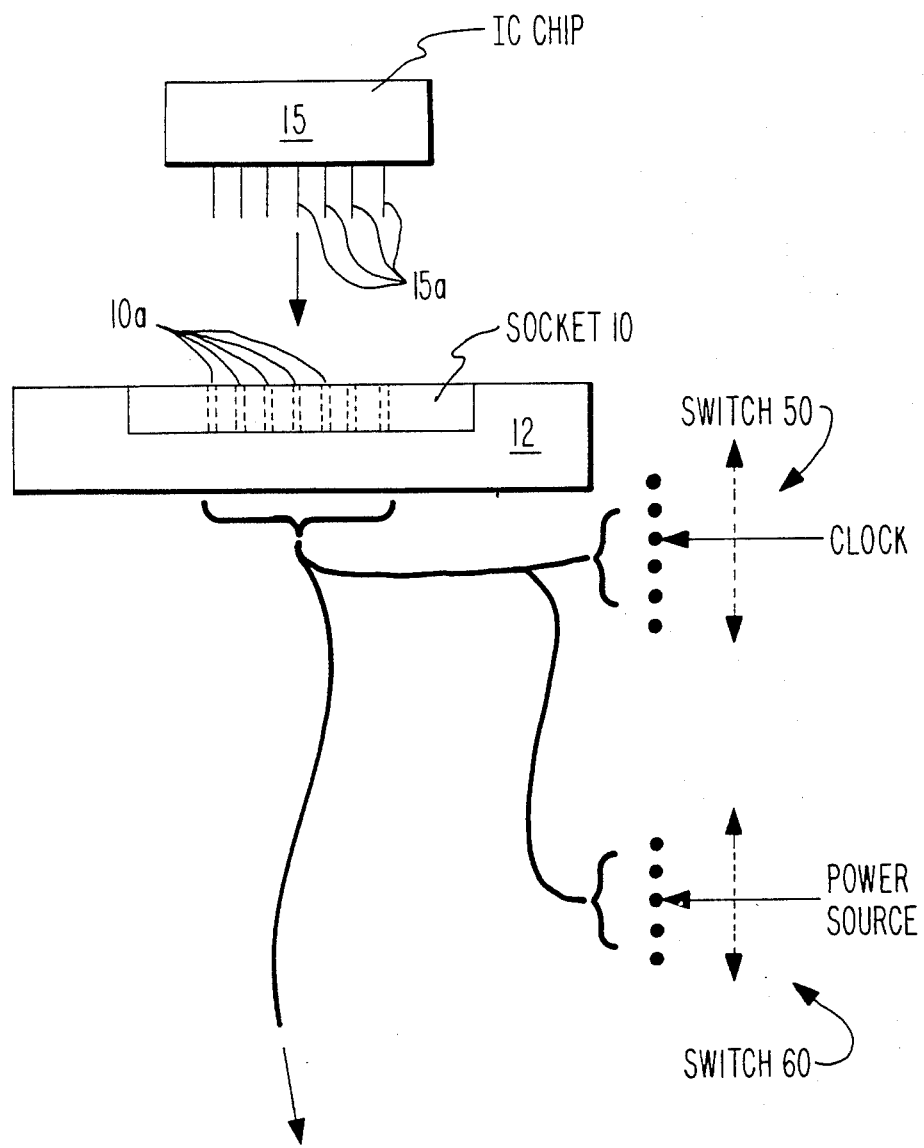
FIG. 4 is a block and schematic electrical diagram illustrating an extension of the invention which may be added to the implementations of FIGS. 1 and 3.

It has been assumed for the preferred implementations of FIGS. 1 and 3 that the integrated circuits to be tested do not have internal storage and thus do not require any clock and/or power inputs. The present invention can advantageously be extended to permit testing of integrated circuits containing internal storage. For this purpose, provision is made for applying clock and/or special power inputs to appropriate terminals of such an integrated circuit. This may be accomplished, for example, as illustrated in FIG. 4 using switches 50 and/or 60 which provide for connecting a clock source 55 and/or power source 65 to selected ones of the socket contacts 10a.

In addition in order to provide for testing an integrated circuit having internal storage in the advantageous manner made possible by the present invention, it is necessary to also take into account the circumstance that the internal storage of such an integrated circuit will ordinarily have an indeterminate state which could result in producing an unpredictable final signature when tested. This problem is overcome in accordance with the present invention by taking advantage of the use of a test pattern generator, such as the N-bit binary counter 120 in FIG. 3, which provides for applying all possible test patterns to a chip being tested.

A preferred manner in which the present invention provides for testing integrated circuits having internal storage will now be considered. It will be understood that such circuits typically provide for clearing and/or loading their internal storage to desired states in response to predetermined input values. Thus, the application of all possible test patterns to the circuit during testing in accordance with the present invention will cause the circuit's internal states to have been loaded (or cleared) to predictable states at least once by the time that the testing is completed. As a result, a circuit having internal storage may be tested in accordance with the invention using the preferred implementation of FIG. 3 by performing the testing twice with the final signature obtained for the first testing being ignored. In other words, the first testing is used to place the internal storage of the circuit to be tested into predictable states. Thus, at the start of the second testing, the states of the internal storage will be predictable, thereby resulting in the obtaining of a predictable final signature after the second testing is completed.

It will thus be apparent that the described implementations are only exemplary and that many modifications in construction, arrangement and use may be made without departing from the scope and spirit of the present invention. For example, the invention may be further extended by providing additional sockets into which integrated circuits of different sizes and terminal geometries may be inserted. In addition, provision may be made for applying test pattern signals to the socket 10 so that only particular ones of the receiving contacts will receive a test signal. Also, it will be apparent that the invention is applicable to the testing of other types of electrical circuits besides integrated circuit chips.

Accordingly, the present invention is to be considered as including all possible modifications and variations encompassed within the scope of the appended claims.

What is claimed is:

1. In a method for testing an electrical circuit having input and output terminals with significantly different input and output impedances, the steps comprising:

applying a test pattern comprised of a plurality of logical signals to the terminals of a circuit to be tested in a manner such that a circuit input terminal will be driven to an acceptable logical level with the resulting signal obtained thereon being recognizable as having the same logical value as the respective test logical signal applied thereto, and such that a circuit output terminal will have a resulting signal thereon which is recognizable as having the same logical value as would normally be produced thereon in response to the test logical signals applied to the input terminals of the circuit; and monitoring the resulting logical signal pattern appearing on the input and output terminals of a circuit being tested in response to said test pattern.

2. The invention in accordance with claim 1, wherein a plurality of different test patterns are serially applied to the terminals of said circuit, and wherein the step of monitoring includes generating a running signature pattern as a function of the resulting logical signal patterns obtained in response to said serially applied test patterns.

3. The invention in accordance with claim 2, wherein said method includes synchronizing the steps of applying said test patterns and generating a running signature pattern.

4. The invention in accordance with claim 2, including the step of applying a clock to a terminal of said circuit.

5. The invention in accordance with claim 2, including the step of applying a source of power to a terminal of said circuit.

6. The invention in accordance with claim 2, wherein the step of monitoring includes combining each resulting logical signal pattern obtained on the inputs and outputs of a circuit being tested with the running signature pattern generated in response to all previously applied test patterns in a manner so as to produce a final signature pattern after the last test pattern has been applied which is indicative of the performance of said circuit.

7. The invention in accordance with claim 6, wherein prior to testing a circuit containing internal storage having unknown states, the circuit is first conditioned by applying all possible test patterns to the terminals of the circuit to cause its internal storage to be placed into predictable states.

8. The invention in accordance with claim 6, wherein said method includes the step of displaying said final signature pattern.

9. The invention in accordance with claim 6, wherein the step of applying causes all possible test patterns to be applied to the terminals of said circuit.

10. The invention in accordance with claim 6, wherein a circuit having an unknown acceptable final signature is tested by first determining the acceptable final signature by obtaining the final signature of a like circuit which is known to provide acceptable performance.

11. The invention in accordance with claim 1, 2, 3, 4, 5, 6, 7, 8, 9 or 10, wherein the step of applying applies each test pattern to the input and output terminals of said circuit using a driving impedance chosen in conjunction with the input and output impedances of the terminals of said circuit so that it is low enough to permit driving an input terminal to an acceptable logical level while being high enough to permit an output terminal to retain a recognizable logical level corresponding to that which would normally be produced thereby in response to the logical signals applied to the input terminals of the circuit by said test pattern.

* * * * *